United States Patent
Liu et al.

(10) Patent No.: US 8,304,770 B2
(45) Date of Patent: Nov. 6, 2012

(54) ACTIVE DEVICE ARRAY SUBSTRATE

(75) Inventors: Chu-Yu Liu, Hsinchu County (TW); Ming-Hung Shih, Pingtung County (TW); Chou-Chin Wu, Taipei County (TW); I-Chun Chen, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 588 days.

(21) Appl. No.: 12/559,508

(22) Filed: Sep. 15, 2009

(65) Prior Publication Data
US 2010/0327284 A1 Dec. 30, 2010

(30) Foreign Application Priority Data
Jun. 30, 2009 (TW) ............................. 98122146 A (51) Int. Cl.
*H01L 31/00* (2006.01)
(52) U.S. Cl. ....... 257/59; 257/72; 257/44; 257/E27.133; 349/44; 349/43; 349/54
(58) Field of Classification Search ................ 257/59, 257/72, E27.026, E27.133, 44; 349/44, 43, 349/54
See application file for complete search history.

(56) References Cited

U.S. PATENT DOCUMENTS

| | | |
|---|---|---|
| 6,259,200 B1 | 7/2001 | Morita et al. |
| 6,791,631 B2 | 9/2004 | Cheng et al. |
| 6,975,367 B2 | 12/2005 | Lim |
| 7,405,783 B2 | 7/2008 | Aoki et al. |
| 7,700,954 B2 * | 4/2010 | Noguchi et al. ................ 257/79 |
| 2006/0028593 A1* | 2/2006 | Lim et al. ........................ 349/44 |
| 2007/0200139 A1* | 8/2007 | Shibata et al. ................ 257/146 |
| 2008/0057604 A1* | 3/2008 | Tanaka ............................ 438/29 |
| 2008/0078999 A1* | 4/2008 | Lai .................................. 257/59 |

* cited by examiner

Primary Examiner — Jerome Jackson, Jr.
Assistant Examiner — Dale E Page
(74) Attorney, Agent, or Firm — Jianq Chyun IP Office (57) ABSTRACT

An active device array substrate including a first patterned conductive layer, a dielectric layer, a second patterned conductive layer, a passivation layer and pixel electrodes is provided. The first patterned conductive layer includes scan lines, common lines, gates and strip floating shielding patterns. The dielectric layer covering the first patterned conductive layer has first contact holes which expose a portion of the common lines, respectively. The second patterned conductive layer includes data lines, sources, drains and strip capacitance electrodes. Each strip capacitance electrode is electrically connected to one of the common lines through one of the first contact holes. A gap is formed between each data line and one strip capacitance electrode, and the strip floating shielding patterns are disposed under the data lines, the gap and the strip capacitance electrodes. Each pixel electrode is electrically connected to one of the drains through one of the second contact holes.

8 Claims, 7 Drawing Sheets

ACTIVE DEVICE ARRAY SUBSTRATE

CROSS-REFERENCE TO RELATED APPLICATION

This application claims the priority benefit of Taiwan application serial no. 98122146, filed Jun. 30, 2009. The entirety of the above-mentioned patent application is hereby incorporated by reference herein and made a part of specification.

BACKGROUND OF THE INVENTION

1. Field of the Invention

The present invention relates to a substrate, and particularly to an active device array substrate.

2. Description of Related Art

Among various flat panel displays (FPD), Liquid Crystal Displays (LCDs) have become mainstream in the market due to their advantages such as high space utilization, low power consumption, absence of radiation, and low electromagnetic interference.

Figure 1A:
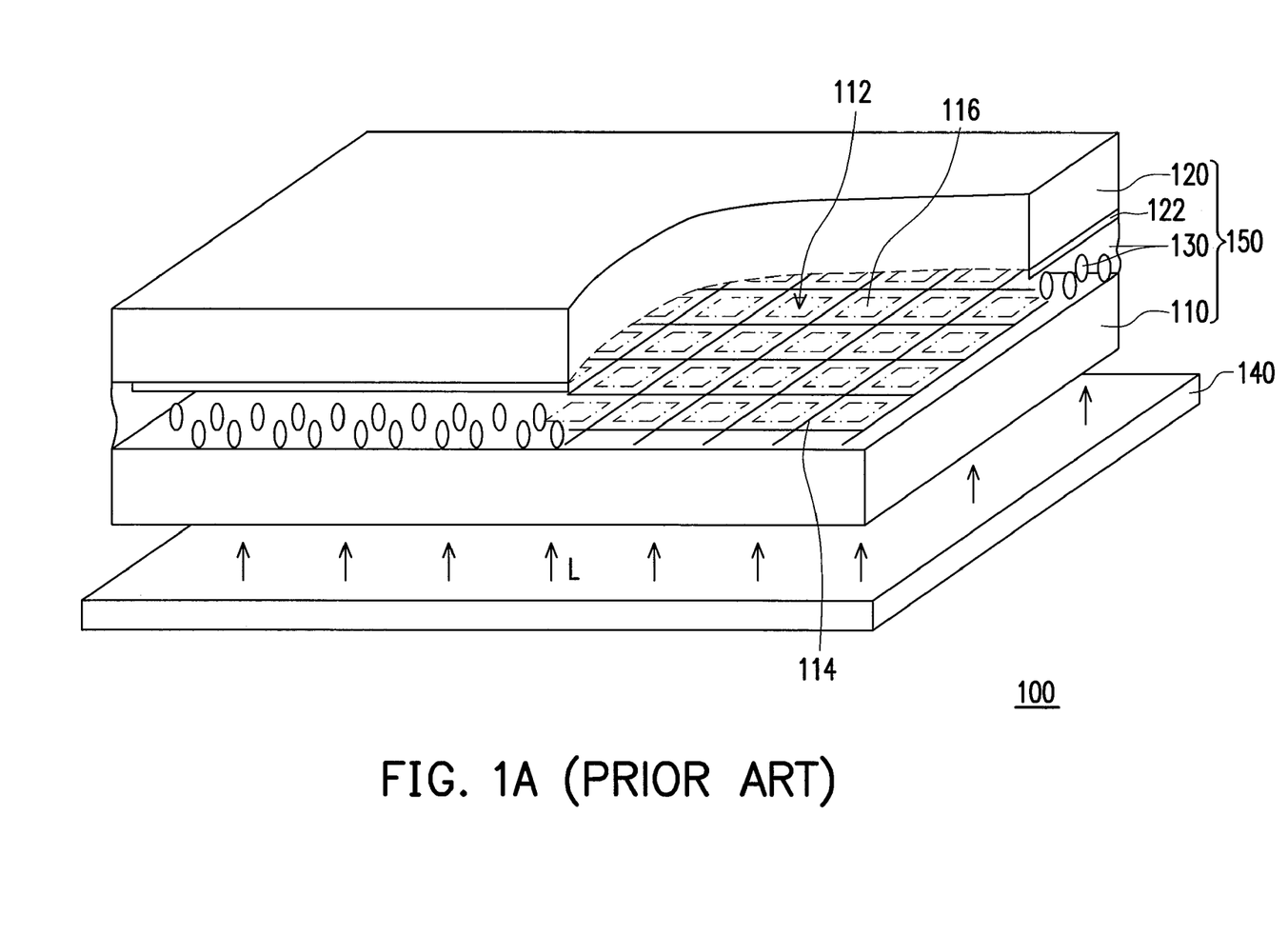
FIG. 1A is a perspective view of a conventional liquid crystal display.

FIG. 1A is a perspective view of a conventional liquid crystal display. Referring to FIG. 1A, the conventional liquid crystal display 100 has an active device array substrate 110, an opposite substrate 120, a liquid crystal layer 130 sandwiched between the active device array substrate 110 and the opposite substrate 120, and a backlight module 140 for providing light. The active device array substrate 110 has a plurality of pixel units 112 and a plurality of signal lines 114 located between the pixel units 112. The opposite substrate 120 has a common electrode 122. Liquid crystal molecules in the liquid crystal layer 130 are twisted to certain degree by means of a voltage difference between a pixel electrode 116 in the pixel units 112 and the common electrode 122, such that the transmittance of light L provided by the backlight module 140 passing through a liquid crystal display panel 150 is controlled, and the liquid crystal display panel 150 displays accordingly.

Figure 1B:
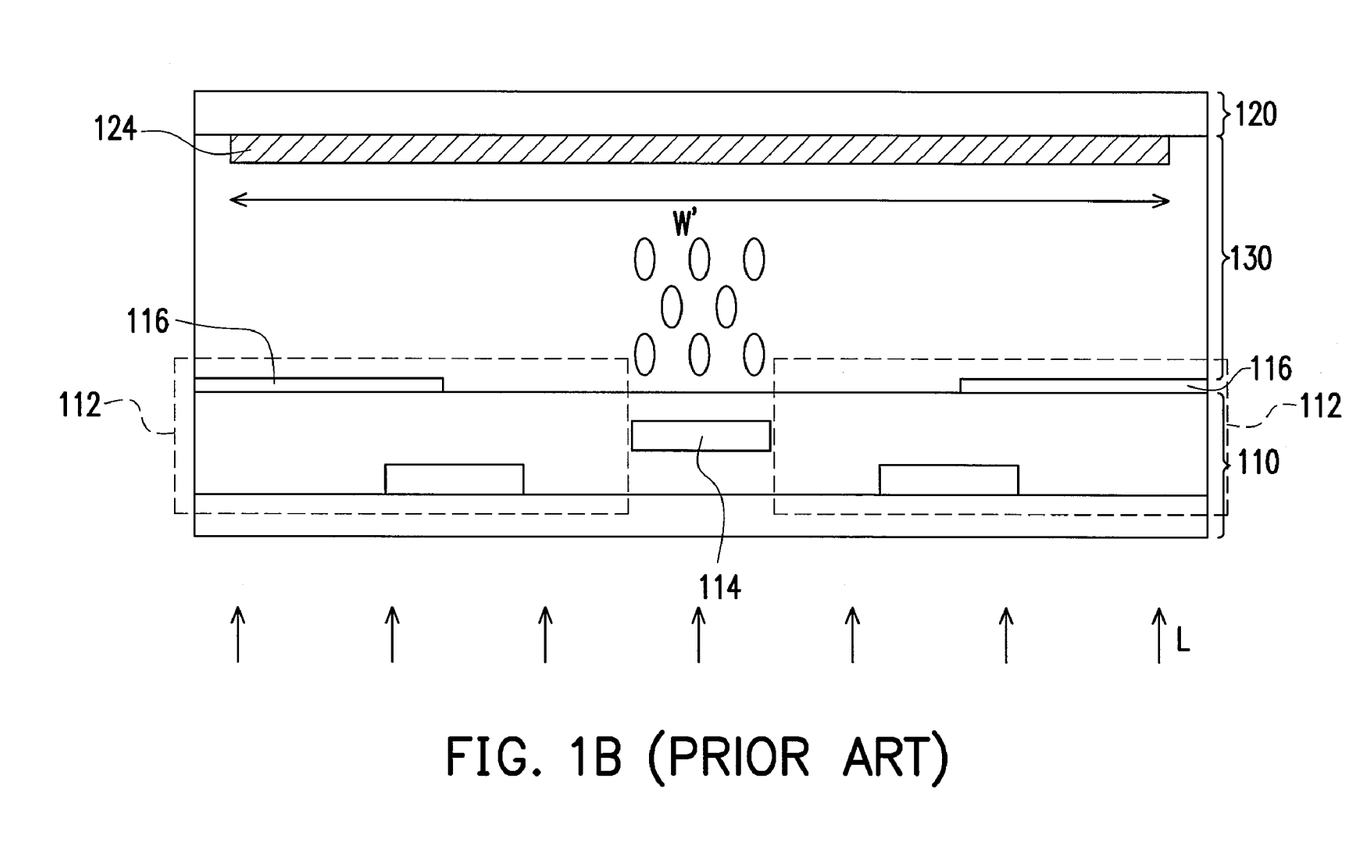
FIG. 1B further provides an enlarged local cross-sectional schematic view of the conventional liquid crystal display in FIG. 1A.

FIG. 1B schematically illustrates an enlarged local cross-sectional view of the conventional liquid crystal display shown in FIG. 1A, wherein a cross-sectional view of two sets of pixel units 112 are shown for illustration. Referring to FIG. 1B, the opposite substrate 120 has a black matrix (BM) 124 (only a black matrix is shown in FIG. 1 for illustration purpose) located above the signal lines 114. As shown in FIG. 1B, since an unexpected twist of the liquid crystal molecules is generated due to the liquid crystal molecules in the liquid crystal layer 130 located above the signal lines 114 being affected by the signal lines 114, such that a light leakage occurs. Therefore, the black matrix 124 is disposed on the opposite substrate 120 located above the signal lines 114 correspondingly, so as to prevent a light leakage by shielding the light that passes through the non-display area (such as an area occupied by the signal lines).

As previously mentioned, when the liquid crystal display 100 displays images, in order to prevent the aforementioned light leakage, the width W' of the black matrix 124 is widened to reduce a light leakage. However, by widening the width W' of the black matrix 124, the aperture ratio of the liquid crystal display panel 15 is decreased, such that the brightness of the liquid crystal display 100 is affected. Therefore, it is an important issue to prevent a light leakage while maintaining the aperture ratio of a liquid crystal display.

SUMMARY OF THE INVENTION

The present invention provides an active device array device which significantly increases the aperture ratio and significantly reduces the parasitical capacitor between data lines and common lines.

As embodied and broadly described herein, the present invention provides an active device array substrate including a substrate, a first patterned conductive layer, a dielectric layer, a second patterned conductive layer, a passivation layer, and a plurality of pixel electrodes. The first patterned conductive layer is disposed on the substrate. The layer includes a plurality of scan lines, a plurality of gates connected with the scan lines, a plurality of common lines, and a plurality of strip floating shielding patterns. The dielectric layer is disposed on the substrate to cover the first patterned conductive layer. The dielectric layer has a plurality of first contact holes, and each of the first contact holes exposes a portion of the common lines, respectively. The second patterned conductive layer is disposed on the dielectric layer. The layer includes a plurality of data lines, a plurality of sources connected with the data lines, a plurality of drains, and a plurality of strip capacitance electrodes, wherein each of the strip capacitance electrodes is electrically connected with one of the common lines through one of the first contact holes. A gap is formed between each of the data lines and one of the strip capacitance electrodes, and each of the strip floating shielding patterns is disposed under the data lines, the gap, and the strip capacitance electrodes. The passivation layer is disposed on the dielectric layer to cover the second patterned conductive layer. The passivation layer has a plurality of second contact holes, and each of the second contact holes exposes one of the drains, respectively. A plurality of pixel electrodes are disposed on the passivation layer, wherein each of the pixel electrodes is electrically respectively connected with one of the drains through one of the second contact holes.

In one embodiment of the present invention, the gap between the aforementioned each of the data lines and, for example, one of the strip capacitance electrodes, is not covered by the pixel electrodes.

In one embodiment of the present invention, the aforementioned scan lines extend in a direction, for example, substantially parallel to the extending direction of the common lines, and each of the common lines is located between two adjacent scan lines, respectively.

In one embodiment of the present invention, the aforementioned data lines extend in a direction, for example, substantially parallel to the extending direction of the strip floating shielding patterns and the strip capacitance electrodes.

In one embodiment of the present invention, the aforementioned gap of the two strip capacitance electrodes on two sides of one of the data lines, for example, is S, the width of each of the strip floating shielding patterns, for example, is W1, the width of each of the data lines, for example, is W2; and W1>S>W2.

In one embodiment of the present invention, the width of the aforementioned each of the strip floating shielding patterns is, for example, W1, the width of each of the data lines is, for example, W2, each of the gaps is, for example, G, and W1>W2+2G.

In one embodiment of the present invention, at least a portion of the aforementioned each of the strip capacitance electrodes, for example, is overlapped with one of the pixel electrodes.

As embodied and broadly described herein, the present invention provides another active device array substrate, including a substrate, a first patterned conductive layer, a dielectric layer, a second patterned conductive layer, a passivation layer, and a plurality of pixel electrodes. The first patterned conductive layer is disposed on the substrate. The layer includes a plurality of scan lines, a plurality of gates connected with the scan lines, and a plurality of strip floating shielding patterns. The dielectric layer is disposed on the substrate to cover the first patterned conductive layer. The dielectric layer has a plurality of first contact holes, and each of the first contact holes exposes a portion of the scan lines, respectively. The second patterned conductive layer is disposed on the dielectric layer. The layer includes a plurality of data lines, a plurality sources connected with the data lines, a plurality of drains, a plurality of strip capacitance electrodes, wherein each of the strip capacitance electrodes is electrically connected with one of the scan lines through one of the first contact holes, a gap is formed between each of the data lines and one of the strip capacitance electrodes, and each of the strip floating shielding patterns is disposed under the data lines, the gap, and the strip capacitance electrodes. The passivation layer is disposed on the dielectric layer to cover the second patterned conductive layer. The passivation layer has a plurality of second contact holes, and each of the second contact holes exposes one of the drains respectively. A plurality of pixel electrodes is disposed on the passivation layer, wherein each of the pixel electrodes is electrically connected with one of the drains through one of the second contact holes.

In one embodiment of the present invention, the gap between the aforementioned each of the data lines, for example, and one of the strip capacitance electrodes is not covered by the pixel electrodes.

In one embodiment of the present invention, the aforementioned data lines extend in a direction substantially parallel to the extending direction of the strip floating shielding patterns and the strip capacitance electrodes.

In one embodiment of the present invention, the aforementioned gap of the two of the strip capacitance electrodes on the two sides of one of the data lines is, for example, S, the width of each of the strip floating shielding patterns is, for example, W1, the width of each of the data lines is, for example, W2, and W1>S>W2.

In one embodiment of the present invention, the width of the aforementioned each of the strip floating shielding patterns is, for example, W1, the width of each of the data lines is, for example, W2, each of the gaps is, for example, G, and W1>W2+2G.

In one embodiment of the present invention, at least a portion of the aforementioned each of the strip capacitance electrodes, for example, is overlapped with one of the pixel electrodes.

Based on the above, through proper arrangement of the strip floating shielding patterns and the strip capacitance electrodes, an aperture ratio is significantly increased and a light leakage is prevented. Further, through the strip capacitance electrodes being electrically connected with the common lines or the scan lines, a storage capacitor for stabilizing a data voltage of the pixel electrodes is further provided. On the other hand, compared with conventional structures, since the crosswise parasitical capacitor between the signal lines (for example, between the data lines and the strip capacitance electrodes) is rather small and has smaller influence on liquid crystal, the parasitical capacitor can be ignored. Therefore, when the pixel aperture ratio is increased, the data lines are not overloaded due to the influence of a parasitical capacitor, and a crosstalk effect between the signal lines is prevented.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 2:
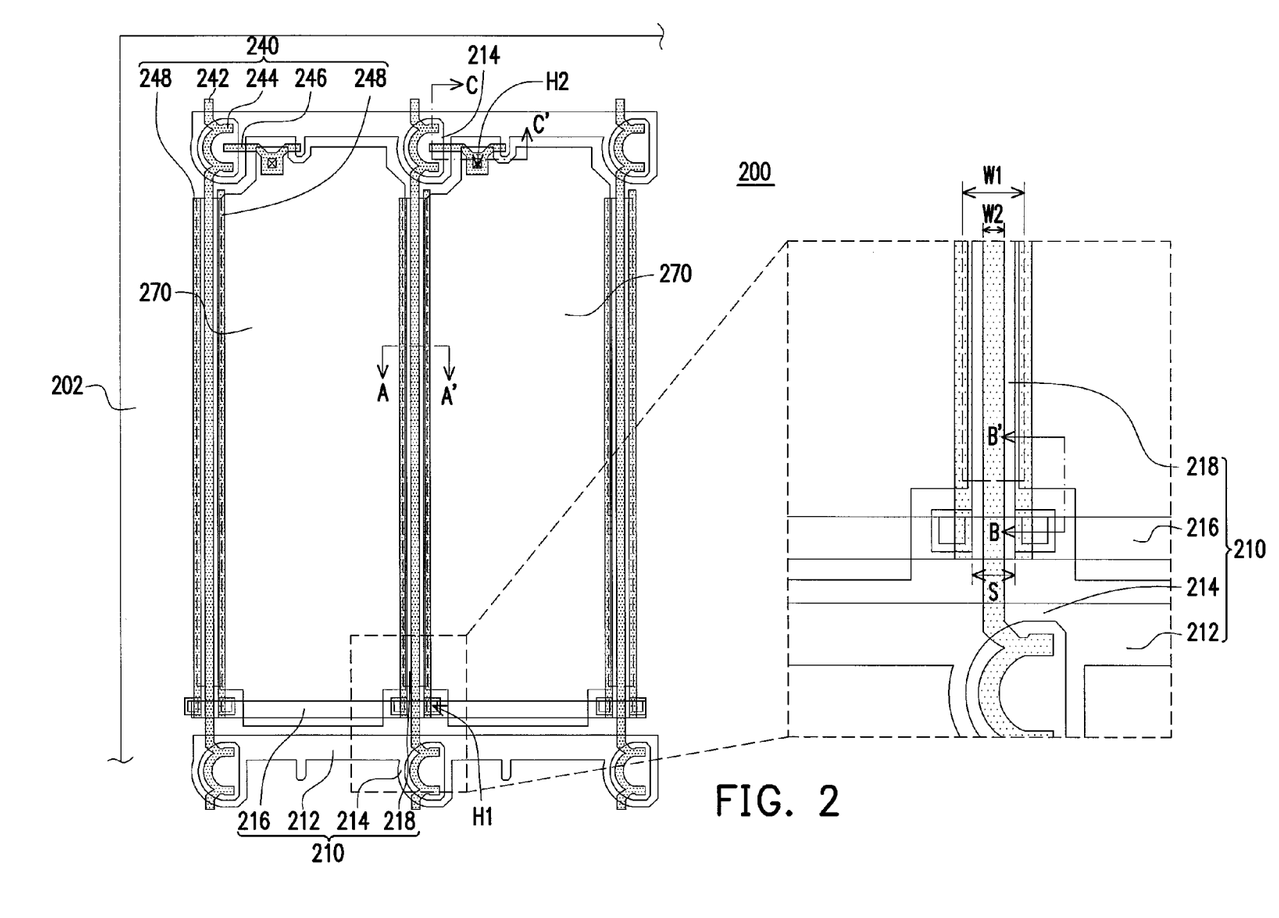
FIG. 2 is a local top view of an active device array substrate of the first embodiment of the present invention.
Figure 3A:
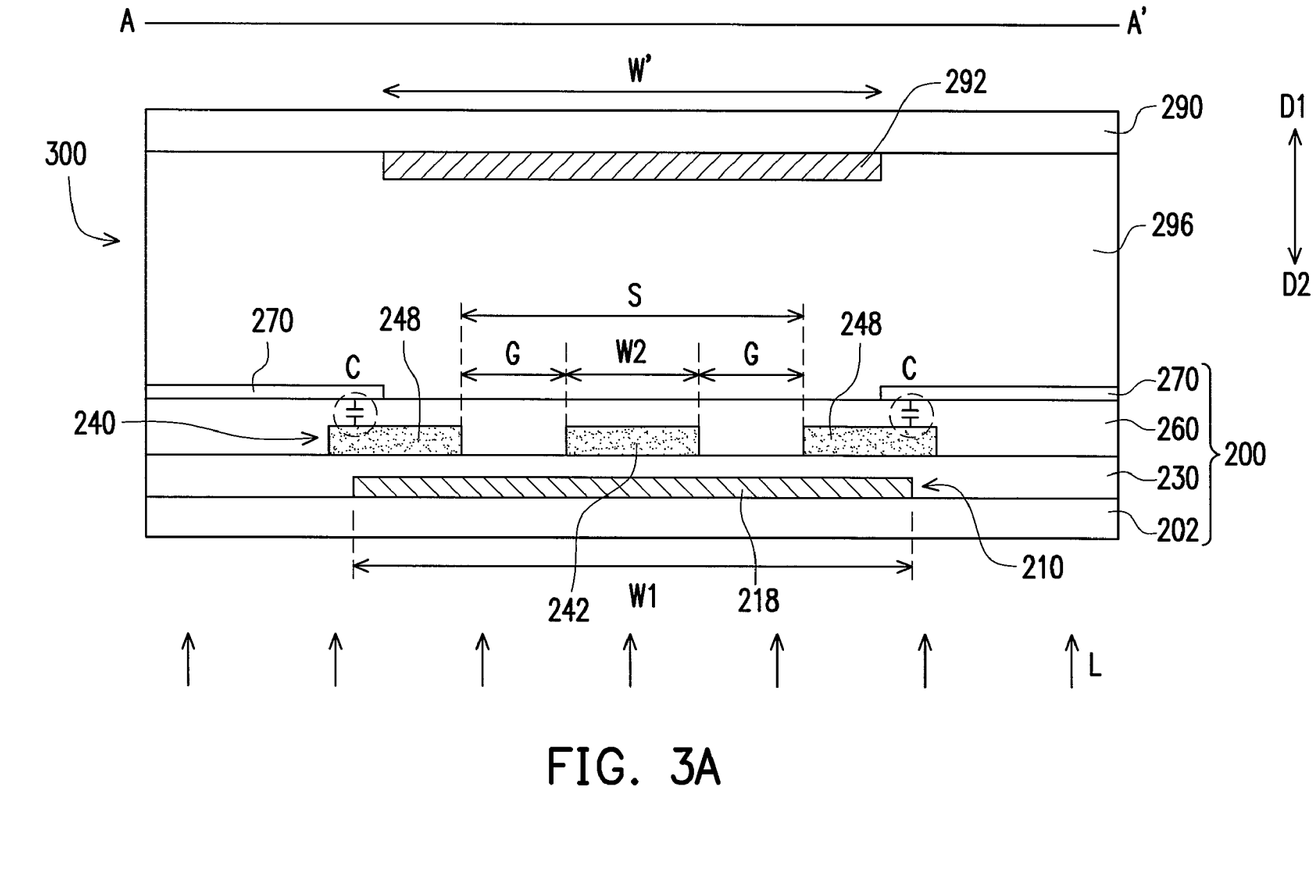
FIG. 3A is a local cross-sectional view of the active device array substrate in FIG. 2 applied to a liquid crystal display.

FIG. 2 is a local top view of an active device array substrate of the first embodiment of the present invention. FIG. 3A is local cross-sectional view of the active device array substrate in FIG. 2 applied to a liquid crystal display, wherein FIG. 3A is cross-sectioned at a position corresponding to the position where the active device array substrate 200 is cross-sectioned along the section line AA' in FIG. 2. Referring to FIGS. 2 and 3A, the active device array substrate 200 of this embodiment includes a substrate 202, a first patterned conductive layer 210, a dielectric layer 230, a second patterned conductive layer 240, a passivation layer 260, and a plurality of pixel electrodes 270.

Referring to FIGS. 2 and 3A, the first patterned conductive layer 210 is disposed on the substrate 202. The first patterned conductive layer 210 includes a plurality of scan lines 212, a plurality of gates 214 connected with the scan lines 212, a plurality of common lines 216, and a plurality of strip floating shielding patterns 218. In this embodiment, the scan lines 212 extend in a direction, for example, substantially parallel to the extending direction of the common lines 216, and each of the common lines 216 is located between two adjacent scan lines 212. The second patterned conductive layer 240 is disposed on the dielectric layer 230, and the second patterned conductive layer 240 includes a plurality of data lines 242, a plurality of sources 244 connected with the data lines 242, a plurality of drains 246, and a plurality of strip capacitance electrodes 248. In this embodiment, the data lines 242 extend in a direction, for example, substantially parallel to the extending direction of the strip floating shielding patterns 218 and the strip capacitance electrodes 248. Moreover, the data lines 242 is substantially perpendicular to the scan lines 212, and a plurality of pixel units are roughly circled by the data lines 242 and the scan lines 212. FIG. 2 only shows two sets of the pixel units for illustration purpose.

Further referring to FIGS. 2 and 3A, in order to clearly illustrate the stacking of different layers, a relative relation of the layers is defined in FIG. 3A, for example, the up and down directions D1 and D2. As shown in FIG. 3A, an opposite substrate 290 has a black matrix 292, which is located above the active device array substrate 200. Moreover, the liquid crystal layer 296 is disposed between the active device array substrate 200 and the opposite substrate 290.

Referring to FIGS. 2 and 3A, it is worth noting that the strip floating shielding patterns 218 are located straight under the data lines 242, and the area of the strip floating shielding patterns 218 is substantially bigger than and to cover the area of the data lines 242. Therefore, the strip floating shielding patterns 218 effectively shield the light L from the backlight module, such that the width W' of the black matrix 292 located on the opposite substrate 290 is significantly reduced, and the overall aperture rate of the liquid crystal display 300 is enhanced. In addition, since the strip floating shielding patterns 218 are not connected with other layers or signal lines, the patterns are separated in an electrically floating state. Consequently, when shielding light to increase the aperture rate, the strip floating shielding patterns 218 also effectively restrain the parasitical capacitor between the strip floating shielding patterns 218 and the data lines 242. By means of the above, the loading of the data lines are effectively controlled, so the power for data driving signal is not required to be increased due to overgreat resistance-capacitance (RC) delay. In addition, since the data lines 242 are not easily influenced by the strip floating shielding patterns 218, the voltage of the data being transmitted is not disturbed and consequently, a crosstalk effect is avoided.

Further referring to FIGS. 2 and 3A, a gap G is formed between each of the data lines 242 and one of the strip capacitance electrodes 248, and each of the strip floating shielding patterns 218 is located under the data lines 242, the gap G, and the strip capacitance electrodes 248.

To be specific, in this embodiment, the gap G between each of the data lines 242 and one of the strip capacitance electrodes 248 is not covered by the pixel electrodes 270, at least a portion of a side of each of the strip capacitance electrodes 248 adjacent to the pixel electrodes 270, for example, is overlapped with one of the pixel electrodes 270, and at least a portion of a side of each of the strip capacitance electrodes 248 adjacent to the data lines 242, for example, is overlapped with one of the strip floating shielding patterns 218, and thereby the floating shielding patterns 218 and the strip capacitance electrodes 248 commonly form a shielding structure.

Further, the gap between the two strip capacitance electrodes 248 at the two sides of one data line 242 is S, the width of each of the strip floating shielding patterns 218 is W1, and the width of each of the data lines 242 is W2. The gap S between the two strip capacitance electrodes 248 at the two sides of one data line 242, the width W1 of the strip floating shielding patterns 218, and the width W2 of the data lines 242, for example, meet the formula W1>S>W2. In other words, the projection of each of the strip floating shielding patterns 218 covers the gap S between the two strip capacitance electrodes 248 and the projection of data lines 242 on the substrate 202. By means of the above, the strip floating shielding patterns 218 and the strip capacitance electrodes 248 commonly form a shielding structure at a long side of the pixel units to effectively shield the light from the backlight module, such that the light does not pass through the data lines 242 and the gap S between the two strip capacitance electrodes 248 at the two sides of one data line 242, and a light leakage is avoided.

To be more specific, the gap between each of the data lines 242 and one of the strip capacitance electrodes 248 is G, the width of each of the strip floating shielding patterns 218 is W1, and the width of each of the data lines 242 is W2. In this embodiment, the gap G between the data lines 242 and one of the strip capacitance electrodes 248, the width W1 of each of the strip floating shielding patterns 218, and the width W2 of the data lines 242, for example, meet the formula W1>W2+2G. By means of the above, the width W1 of the strip floating shielding patterns 218 effectively shield the light from the backlight module, such that the light does not pass through the data lines 242 and the gap G between the data lines 242 and the strip capacitance electrodes 248, and a light leakage is avoided when the aperture ratio is increased. As a result, as shown in FIG. 3A, the width W' of the black matrix 292 on the opposite substrate 290 can be reduced to be smaller than the width W1 of the strip floating shielding patterns 218, and thereby the aperture ratio is greatly increased.

Undoubtedly, based on different product requirements, such as the size of the cell gap between the active device array substrate 200 and the opposite substrate 290, the aperture ratio, or the brightness, designers can moderately adjust the width W1 of the strip floating shielding patterns 218, the strip capacitance electrodes 248, the gap G between the data lines 242 and the strip capacitance electrodes 248, and the gap S between the two of the strip capacitance electrodes 248 at the two sides of one data line 242, so as to further enhance the shielding effect of the strip floating shielding patterns 218.

Figure 3B:
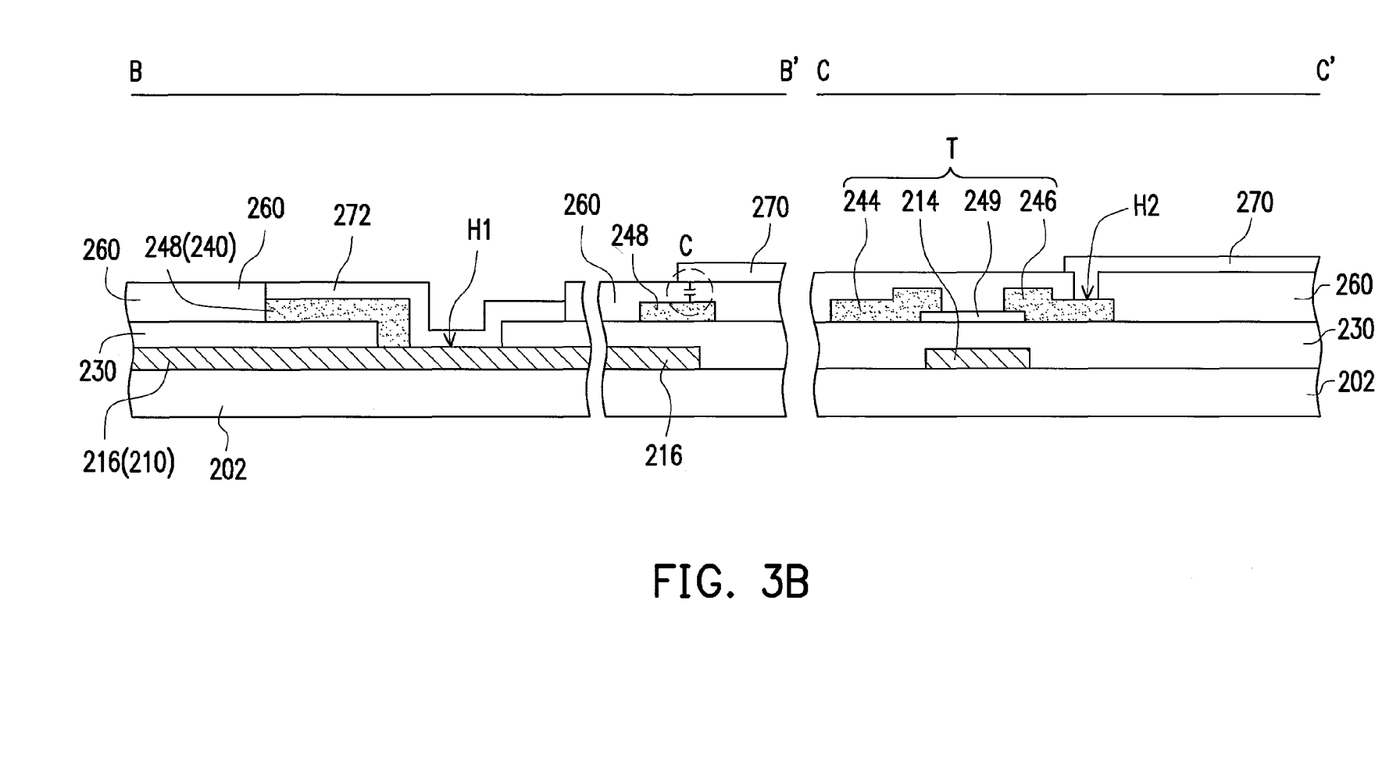
FIG. 3B is a local cross-sectional schematic view of the active device array substrate along the section lines BB' and CC' in FIG. 2.

FIG. 3B is a local cross-sectional schematic view of an active device array substrate along the section lines BB' and CC' in FIG. 2. Referring to FIGS. 2 and 3B, the dielectric layer 230 is disposed on the substrate 202 to cover the first patterned conductive layer 210, wherein the dielectric layer 230 has a plurality of contact holes H1, and each of the first contact holes H1 exposes a portion of the common lines 216, respectively. The second patterned conductive layer 240 is disposed on the dielectric layer 230. In particular, each of the strip capacitance electrodes 248 is electrically connected to one of the common lines 216 through one of the first contact holes H1.

As shown in FIGS. 2 and 3B, the passivation layer 260 is disposed on the dielectric layer 230 to cover the second patterned conductive layer 240. The passivation layer 260 has a plurality of second contact holes H2, and each of the second contact holes H2 exposes one of the drains 246 respectively. A plurality of pixel electrodes 270 are disposed on the passivation layer 260, wherein each of the pixel electrodes 270 is electrically connected to one of the drains 246 through one of the second contact holes H2. In other words, in a pixel unit, the gates 214, an active layer 249, the sources 244, and the drains 246 constitute an active device T, and the data lines 242 input corresponding data signals into corresponding pixel electrodes 270 by the control of the active device T, such that a display result is achieved.

It is worth noting that in this embodiment, each of the strip capacitance electrodes 248 is electrically connected to one of the common lines 216 through one of the first contact holes H1, and thereby a storage capacitor C on the common lines 216 (Cst on common) structure is formed. In other words, in a pixel unit, the pixel electrodes 270, the passivation layer 260, the strip capacitance electrodes 248 at the two sides, and the common lines commonly constitute a storage capacitor C on the common lines 216 structure. Consequently, the strip capacitance electrodes 248 further increase the storage capacitor value of the pixel units, so as to further stabilize the data signal of the pixel electrodes 270. In addition, by disposing the strip capacitance electrodes 248 at two sides of the pixel units, the interference of the data signal transmitted by the data lines 242 with the data signal stored in the pixel electrodes 270 is further restrained.

Moreover, as shown in FIG. 3B, in this embodiment, the strip capacitance electrodes 248 located at the first contact holes H1 further ensure the electrical connection between the strip capacitance electrodes 248 and the common lines 216 through an assistant contact electrode 272. For example, the contact electrode 272 is produced using the same material and the same mask process with the pixel electrodes 270.

In practice, when the active device array substrate 200 is applied to a liquid crystal display, since the strip floating shielding patterns 218 effectively shield the light from the backlight module, a light leakage is significantly prevented. Moreover, when the aperture ratio is increased, by electrically connecting the strip capacitance electrodes 248 with the common lines 216, the storage capacitor C is built on the common lines 216, so as to stabilize the data voltage of the pixel electrodes 270. Furthermore, by means of the design of the aforementioned strip floating shielding patterns 218 and strip capacitance electrodes 248, the parasitical capacitor between the data lines 242 and the strip floating shielding patterns 218 is greatly reduced, such that the data lines 242 are not overloaded, and a crosstalk effect between the signal lines is avoided.

Second Embodiment

Figure 4:
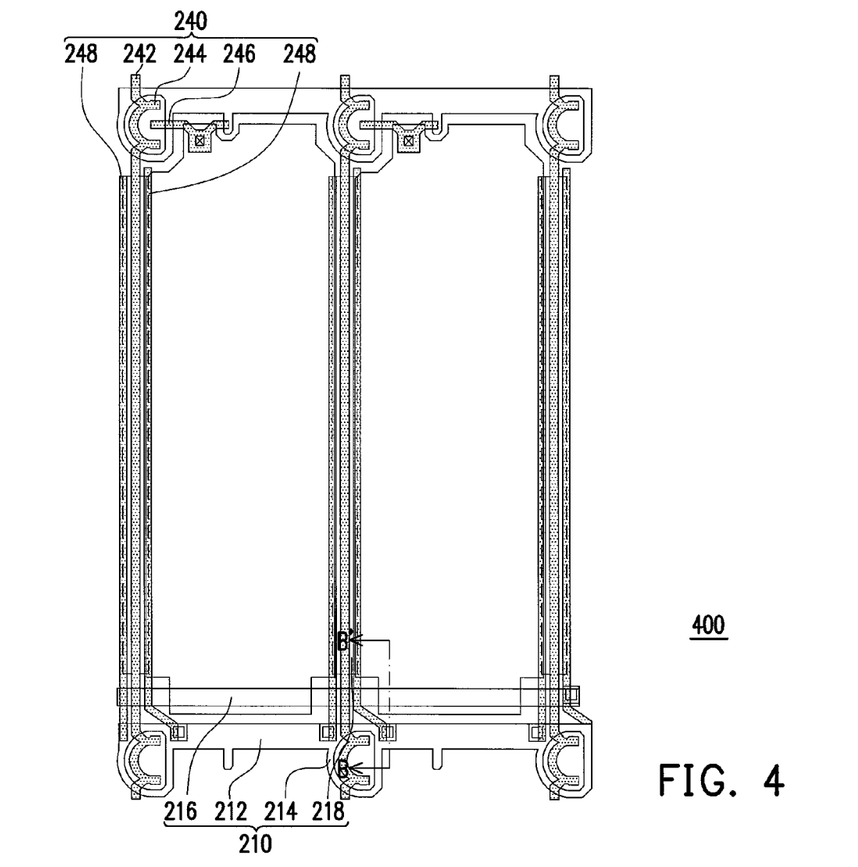
FIG. 4 is a local top view of an active device array substrate of the second embodiment of the present invention.

FIG. 4 is a local top view of an active device array substrate of the second embodiment of the present invention. Referring to FIG. 4, an active device array substrate 400 of this embodiment is similar to the active device array substrate 200 of the first embodiment; however, in the pixel units of the active device array substrate 400 of this embodiment, the storage capacitor is in a storage capacitor on scan lines 212 (Cst on scan line) structure. For clearer illustration, identical reference numerals are used on elements identical with those in the first embodiment.

Figure 5:
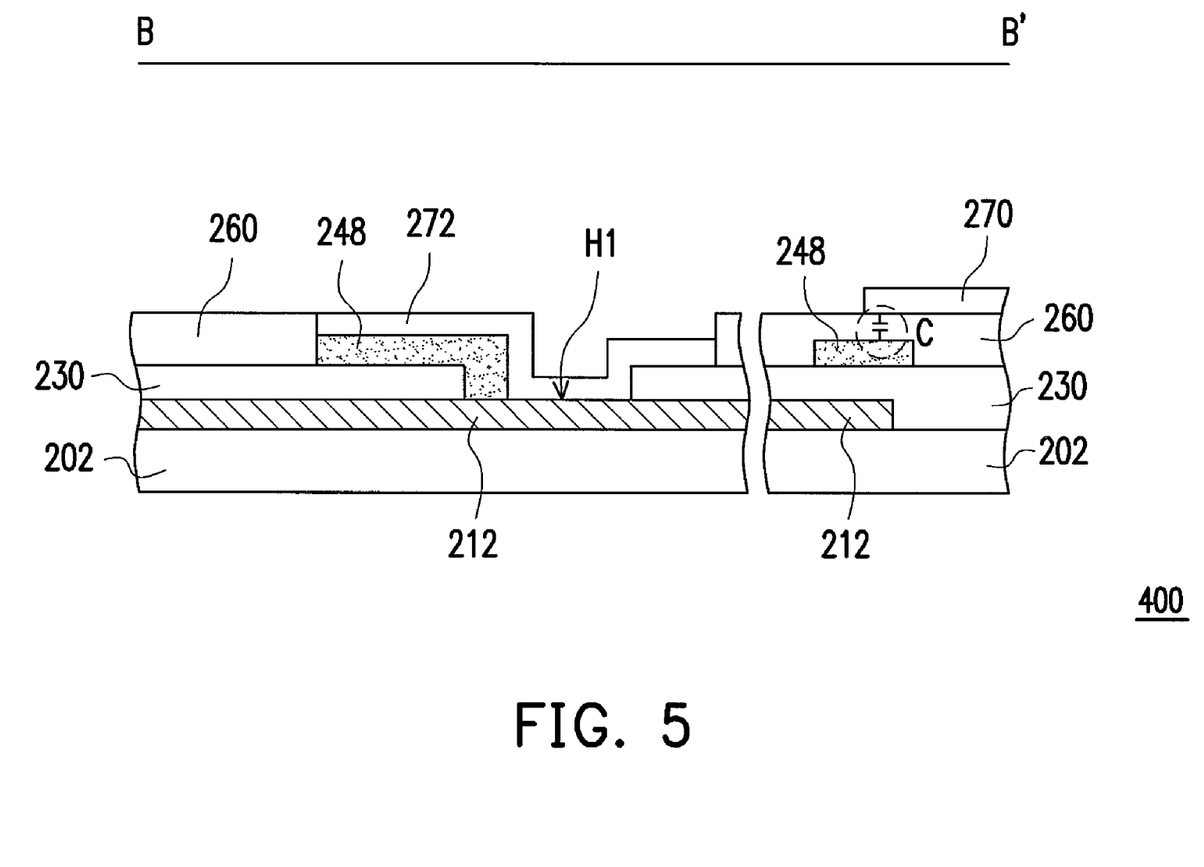
FIG. 5 is a cross-sectional schematic view along the section line BB' in FIG. 4.

FIG. 5 is a cross-sectional schematic view along the section line BB' in FIG. 4. Referring to FIG. 5, in this embodiment, the first contact holes H1 of the dielectric 230 is located above the scan lines 212. In other words, the first contact holes H1 exposes a portion of the scan lines 212, respectively. Moreover, each of the strip capacitance electrodes 248 is electrically connected to one of the scan lines 212 through one of the first contact holes H1. The rest of the elements and design considerations of this embodiment are the same as those of the first embodiment, and thus are omitted here.

As shown in FIG. 5, by electrically connecting each of the strip capacitance electrodes 248 with one of the scan lines 212, in a pixel unit, the pixel electrodes 270, the passivation layer 260, the strip capacitance electrodes 248 at the two sides, and the scan lines 212 commonly constitute a storage capacitor C on the scan lines 212 structure. It is worth mentioning that in this embodiment, the strip capacitance electrodes 248, for example, are electrically connected with a next one of the scan lines 212. By the aforementioned arrangement, the strip capacitance electrodes 248 further increase the value of the storage capacitor of the pixel units, and during the shutdown period of the active device in the pixel units, the data signal of pixel electrodes 270 is stabilized without being interfered. In addition, by disposing the strip capacitance electrodes 248 at two sides of the pixel units, the interference of the data signal transmitted by the data lines 242 with the data signal stored in the pixel electrodes 270 is further restrained.

Moreover, as shown in FIG. 5, in this embodiment, the strip capacitance electrodes 248 located at the first contact holes H1 further ensure the electrical connection between the strip capacitance electrodes 248 and the scan lines 212 through an assistant contact electrode 272. For example, the contact electrode 272 is produced using the same material and the same mask process with the pixel electrodes 270.

Based on the above, the active device array substrate of the present invention uses a proper arrangement of the strip floating shielding patterns being electrically connected with the common lines or scan lines, such that the aperture ratio is greatly increased, and when the active device array substrate of the present invention is applied to a liquid crystal display, a light leakage is prevented and the brightness is enhanced. In addition, the strip capacitance electrodes provide a storage capacitor which stabilizes the data voltage of the pixel units. Since the parasitical capacitor between the data lines and common lines can be ignored, when the pixel aperture ratio is increased, the data lines are not overloaded due to the parasitical capacitor, and a crosstalk effect between the signal lines are prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active device array substrate, comprising:
    a substrate;
    a first patterned conductive layer disposed on the substrate, the first patterned conductive layer comprising a plurality of scan lines, a plurality of gates connected with the scan lines, a plurality of common lines, and a plurality of strip floating shielding patterns;
    a dielectric layer disposed on the substrate to cover the first patterned conductive layer, the dielectric layer having a plurality of first contact holes, and each of the first contact holes exposing a portion of the common lines, respectively;
    a second patterned conductive layer disposed on the dielectric layer, the second patterned conductive layer comprising a plurality of data lines, a plurality of sources connected with the data lines, a plurality of drains, and a plurality of strip capacitance electrodes, wherein each of the strip capacitance electrodes is electrically connected with one of the common lines through one of the first contact holes;
    a passivation layer disposed on the dielectric layer to cover the second patterned conductive layer, the passivation layer having a plurality of second contact holes, each of the second contact holes exposing one of the drains respectively; and
    a plurality of pixel electrodes disposed on the passivation layer, wherein each of the pixel electrodes is electrically connected with one of the drains through one of the second contact holes.

2. The active device array substrate according to claim 1, wherein the scan lines extend in a direction substantially parallel to the extending direction of the common lines, and each of the common lines is respectively located between the two adjacent scan lines.

3. The active device array substrate according to claim 1, wherein the data lines extend in a direction substantially parallel to the extending direction of the strip floating shielding patterns and the strip capacitance electrodes.

4. The active device array substrate according to claim 1, wherein a gap between the two of the strip capacitance electrodes located at two sides of one of the data lines is S, a width of each of the strip floating shielding patterns is W1, a width of each of the data lines is W2, and W1>S>W2.

5. The active device array substrate according to claim 1, wherein a gap is formed between each of the data lines and one of the strip capacitance electrodes, and each of the strip floating shielding patterns is located under the data lines, the gap, and the strip capacitance electrodes.

6. The active device array substrate according to claim 5, wherein a width of each of the strip floating shielding patterns is W1, a width of each of the data lines is W2, each of the gaps is G, and W1>W2+2G.

7. The active device array substrate according to claim 5, wherein a gap between each of the data lines and one of the strip capacitance electrodes is not covered by the pixel electrodes.

8. The active device array substrate according to claim 1, wherein at least a portion of each of the strip capacitance electrodes is overlapped with one of the pixel electrodes.

* * * * *